United States Patent
Reboh et al.

(10) Patent No.: US 9,431,538 B2
(45) Date of Patent: Aug. 30, 2016

(54) ENHANCED METHOD OF INTRODUCING A STRESS IN A TRANSISTOR CHANNEL BY MEANS OF SACRIFICIAL SOURCES/DRAIN REGIONS AND GATE REPLACEMENT

(71) Applicants: Commissariat a l'energie atomique et aux energies alternatives, Paris (FR); STMICROELECTRONICS, Inc., Coppell, TX (US)

(72) Inventors: Shay Reboh, Sassenage (FR); Pierre Morin, Albany, NY (US)

(73) Assignees: Commissariat a l'energie atomique et aux energies alternatives, Paris (FR); STMICROELECTRONICS Inc., Coppell, TX (US)

( * ) Notice: Subject to any disclaimer, the term of this patent is extended or adjusted under 35 U.S.C. 154(b) by 0 days.

(21) Appl. No.: 14/950,833

(22) Filed: Nov. 24, 2015

(65) Prior Publication Data
US 2016/0149037 A1    May 26, 2016

(30) Foreign Application Priority Data
Nov. 25, 2014    (FR) .................................. 14 61459

(51) Int. Cl.
| | | |
|---|---|---|
| H01L 21/336 | (2006.01) | |
| H01L 29/78 | (2006.01) | |
| H01L 29/16 | (2006.01) | |
| H01L 29/161 | (2006.01) | |

(Continued)

(52) U.S. Cl.
CPC ....... *H01L 29/7848* (2013.01); *H01L 29/0649* (2013.01); *H01L 29/161* (2013.01); *H01L 29/165* (2013.01); *H01L 29/1608* (2013.01); *H01L 29/66545* (2013.01)

(58) Field of Classification Search
CPC ............. H01L 29/7848; H01L 29/165; H01L 29/02532; H01L 29/1054; H01L 29/1608; H01L 29/66636; H01L 29/0649; H01L 29/161; H01L 29/66545; H01L 21/02381; H01L 21/02529
See application file for complete search history.

(56) References Cited

U.S. PATENT DOCUMENTS 7,825,477 B2 *  11/2010  Hsiao .............. H01L 21/823807
                                           257/369
8,741,726 B2 *  6/2014   Lin .................. H01L 21/02057
                                           257/E21.43

(Continued)

OTHER PUBLICATIONS

U.S. Appl. No. 14/791,713, filed Jul. 6, 2015, Shay Reboh, et al.

(Continued)

*Primary Examiner* — Michael Trinh
(74) *Attorney, Agent, or Firm* — Oblon, McClelland, Maier & Neustadt, L.L.P.

(57) ABSTRACT

Method of making at least one transistor strained channel semiconducting structure, comprising steps to form a sacrificial gate block and insulating spacers arranged in contact with the lateral faces of the sacrificial gate block, form sacrificial regions in contact with the lateral faces of said semiconducting zone, said sacrificial regions being configured so as to apply a strain on said semiconducting zone, remove said sacrificial gate block between said insulating spacers, replace said sacrificial gate block by a replacement gate block between said insulating spacers, remove said sacrificial regions, and replace said sacrificial regions by replacement regions in contact with the lateral faces of said semiconducting zone, on a semiconducting zone that will form a transistor channel region.

18 Claims, 11 Drawing Sheets

(51) Int. Cl.
*H01L 29/165* (2006.01)
*H01L 29/66* (2006.01)
*H01L 29/06* (2006.01)

(56) References Cited

U.S. PATENT DOCUMENTS

| | | | |
|---|---|---|---|
| 2005/0090066 A1 | 4/2005 | Zhu et al. | |
| 2009/0321843 A1* | 12/2009 | Waite | H01L 21/823807 257/369 |
| 2011/0269278 A1 | 11/2011 | Hoentschel et al. | |
| 2012/0302019 A1* | 11/2012 | Cheng | H01L 21/823814 438/217 |
| 2014/0106529 A1* | 4/2014 | Morin | H01L 21/28518 438/283 |
| 2014/0160491 A1 | 6/2014 | Bouillet et al. | |
| 2015/0155170 A1 | 6/2015 | Reboh et al. | |
| 2015/0179474 A1 | 6/2015 | Maitrejean et al. | |
| 2015/0179665 A1 | 6/2015 | Reboh et al. | |

OTHER PUBLICATIONS

U.S. Appl. No. 14/802,283, filed Jul. 17, 2015, Perrine Batude, et al.
French Preliminary Search Report issued Jul. 9, 2015 in French Application 14 61459 filed on Nov. 25, 2014 (with English Translation of Categories of Cited Documents).
Scott E. Thompson, et al., "A Logic Nanotechnology Featuring Strained-Silicon", IEEE Electron Device Letters, vol. 25, (4), 2004, 3 pgs.
T. Ghani, et al., "A 90nm High Volume Manufacturing Logic Technology Featuring Novel 45 nm Gate Length Strained Silicon CMOS Transistors", IEEE, IEDM 03, 2003, 3 pgs.
Peter Verheyen, et al., "Strain Enhanced nMOS Using In Situ Doped Embedded Si1—xCx S/D Stressors With up to 1.5% Substitutional Carbon Content Grown Using a Novel Deposition Process", IEEE Electron Device Letters, vol. 29, (11), 2008, 3 pgs.

* cited by examiner

ENHANCED METHOD OF INTRODUCING A STRESS IN A TRANSISTOR CHANNEL BY MEANS OF SACRIFICIAL SOURCES/DRAIN REGIONS AND GATE REPLACEMENT

TECHNICAL DOMAIN AND STATE OF THE ART

This invention relates to the domain of microelectronics and more specifically transistors.

It is well known that transistor performances can be improved by introducing a mechanical strain in the channel region of a transistor. A tensile strain is applied to improve the mobility of electrical carriers in N type transistors while a compressive strain is generated to improve the mobility of electrical carriers in P type tra nsistors.

A method for applying a strain to a channel region of a transistor is to form source and drain regions from a semiconducting material with a lattice parameter different from that of the channel region.

The document <<A Logic Nanotechnology Featuring Strained-Silicon>> Scott E. Thompson et al, IEEE ELECTRON DEVICE LETTERS, vol. 25, No. 4, April 2004 191, discloses an example method in which a silicon (Si) channel region is compressively strained through silicon-germanium (SiGe) source and drain regions.

The document <<Strain Enhanced NMOS Using In Situ Doped Embedded Si1−xCx S/D Stressors With up to 1.5% Substitutional Carbon Content Grown Using a Novel Deposition Process>>, Peter Verheyen et al., IEEE ELECTRON DEVICE LETTERS, Vol. 29, No. 11, November 2008, discloses a method for applying a tensile stress on an Si channel region with source and drain regions made of silicon doped with Carbon (Si:C).

One method of increasing the compressive strain in the channel of a P type transistor with a silicon channel using silicon-germanium regions would be to increase the germanium (Ge) content in the silicon-germanium alloy.

However, silicon-germanium regions become more difficult to dope as their germanium content increases. Thus, it is difficult to optimise the electrical conductivity of silicon-germanium regions with a high content of germanium.

One solution for increasing the tensile strain in a channel of an N type transistor with a silicon channel using regions of silicon alloy doped with Carbon (Si:C) would be to increase the content of carbon (C) in the carbon-doped silicon (Si:C). However, carbon-doped silicon (Si:C) with a high content of substitution carbon is thermally unstable during annealing at high temperature. It is also difficult to dope carbon-doped silicon with a high content of substitution carbon correctly, for example with Phosphorus.

The problem arises of finding a new method that does not have the disadvantages mentioned above so that the generated strain in transistor channels can be improved, while keeping appropriate electrical properties for source and drain zones, particularly in terms of conductivity, contact resistance and leakage current at junctions.

PRESENTATION OF THE INVENTION

One purpose of this invention is to disclose a method that can induce a mechanical elastic strain in a transistor channel structure through source and drain zones while maintaining optimised electrical properties in source and drain regions.

To achieve this, sacrificial source and drain regions are used that are optimised to induce a strain in the channel region and this strain is then fixed in the channel using the gate stack, and the sacrificial source and drain regions are then replaced by other source and drain regions for which electrical properties have been optimised.

One embodiment of this invention thus applies to a method of making at least one transistor strained channel semiconducting structure, comprising the following steps:

form a sacrificial gate block and insulating spacers arranged in contact with the lateral faces of the sacrificial gate block, on a semiconducting zone based on a first semiconducting material comprising a region that will form a transistor channel region;

form sacrificial regions on each side of the semiconducting zone, the sacrificial regions being based on a second semiconducting material and being configured so as to induce a strain in the semiconducting zone;

remove the sacrificial gate block;

replace the sacrificial gate block by a replacement gate block between the insulating spacers;

remove the sacrificial regions;

replace the sacrificial regions by replacement regions located on each side of the semiconducting zone, the replacement regions being based on a third semiconducting material different from the second semiconducting material.

Firstly, the sacrificial regions are made from a material optimised to induce a strain in the semiconducting zone that will contain a transistor channel region.

The strain is then at least partially fixed or blocked by eliminating the sacrificial gate and replacing it by another gate stack. It is then said that the strain is memorised.

The sacrificial regions are then removed and replaced by another material. Since the applied stress is memorised, a replacement material can be chosen that is less appropriate for straining the channel than the material used for sacrificial regions, but that has other better properties than the material in sacrificial regions.

In particular, the replacement material may be optimised in terms of electrical characteristics and/or thermal stability and/or it may be easier to dope than the material in the sacrificial regions.

According to one possible embodiment of the method, the third semiconducting material may be doped.

According to one possible embodiment, the third semiconducting material may be different from the second semiconducting material particularly due to its Germanium concentration, the third semiconducting material and the second semiconducting material having different Germanium concentrations from each other.

Advantageously, the sacrificial regions are arranged in contact with the lateral faces of the semiconducting zone.

Advantageously, the replacement regions are arranged in contact with the lateral faces of the semiconducting zone.

Advantageously, the third semiconducting material is doped in situ during the formation of replacement regions by epitaxy.

The replacement regions may further be doped by ion implantation and then thermal annealing.

According to one possible embodiment, the transistor may be a P type transistor, said second semiconducting material being adapted to strain the semiconducting zone in compression.

In this case, said sacrificial regions may be regions based on $Si_{1-x}Ge_x$ (where x>0), particularly when said semiconducting zone is formed from silicon.

$Si_{1-x}Ge_x$ sacrificial regions may have a high germanium concentration in order to optimise the compressive strain in the silicon zone. A high germanium concentration refers to a concentration x such that x≥35% and preferably x≥50%.

In this case, said replacement regions may be formed from a material that it is easier to dope than $Si_{1-x}Ge_x$, such as $Si_{1-y}Ge_y$ (where y<x) or silicon.

According to one possibility, said sacrificial regions are regions based on $Si_xGe_{1-x}$ formed by condensation of germanium, in other words by a method in which silicon-germanium regions are formed on a silicon layer and then oxidised in order to induce diffusion of germanium in silicon facing silicon-germanium regions that are not protected by a stencil.

According to another possible embodiment, the transistor may be an N-type transistor, the second semiconducting material being adapted to apply a tensile strain in the semiconducting zone.

In this case, said sacrificial regions may be regions based on carbon-doped silicon (Si:C), particularly when said semiconducting zone is formed from silicon. In particular, Si:C sacrificial regions may have a high carbon content to optimise the tensile strain in the silicon zone.

Replacement regions can then be formed from a material such as silicon that is easier to dope and has better electron mobility and better thermal stability than Si:C.

According to one possible embodiment, the method may further include a step to etch the semiconducting layer before the formation of sacrificial regions, so as to remove a thickness from the semiconducting layer and to expose lateral faces of the semiconducting zone, the sacrificial regions then being formed on a remaining thinned part of the semiconducting layer located on each side of the semiconducting zone, the sacrificial regions being arranged in contact with the lateral faces of the semiconducting zone.

A higher strain can be applied on the semiconducting zone with such a method.

According to one possible embodiment of the method, it may further comprise the following sequence of steps once or several times after said sacrificial gate block has been replaced by a replacement gate and before said sacrificial regions have been eliminated:

eliminate the insulating spacers, replace the insulating spacers by other insulating spacers.

With such a method, an increased strain can be applied on the semiconducting zone.

Advantageously, the surface semiconducting layer forms part of a semiconductor on insulator type substrate.

This invention further relates to a microelectronic device made using a method like that described above.

This invention further relates to a method of making a microelectronic device using a method like that defined above.

BRIEF DESCRIPTION OF THE DRAWINGS

Other objectives, characteristics and advantages of the invention will become clearer after reading the following description, with reference to the appended drawings on which.

The various elements shown in the figures are not necessarily all shown at the same scale, in order to make the figures more easily understandable.

Furthermore, throughout the following description, terms that depend on the orientation, such as <<under>>, <<on>>, <<above>>, <<lateral>> etc. apply to a structure when the structure is oriented as shown on the figures.

DETAILED DESCRIPTION OF PARTICULAR EMBODIMENTS

An example of a method to make at least one semiconducting structure of a strained transistor channel will be described with reference to FIGS. 1A to 1I.

Such a method may be applied to form a P type transistor with a transistor channel that is compressively strained.

The initial material may be a semiconductor on insulator type substrate that includes a semiconducting support layer 10, an insulating layer 11 that covers the support layer 10, and a surface semiconducting layer 12 located on the insulating layer 11 and that is in contact with this insulating layer 11.

One example of a semiconductor on insulator type substrate is the SOI (Silicon On Insulator) substrate, in which the surface semiconducting layer 12 is made from Si and the insulating layer 12 commonly called a BOX (Buried OXide) layer is made from silicon dioxide.

The insulating layer 11 may for example be between 10 nm and 150 nm thick. The surface semiconducting layer 12 may for example be between 10 nm and 100 nm thick.

Advantageously, the transistor may be made using an UTBB (ultra-thin-body-and-box) FDSOI (Fully Depleted Silicon on Insulator) technology. In this case, the insulating layer 11 may for example be between 5 nm and 35 nm thick, while the surface semiconducting layer 12 may for example be between 4 nm and 30 nm thick.

Figure 1A:
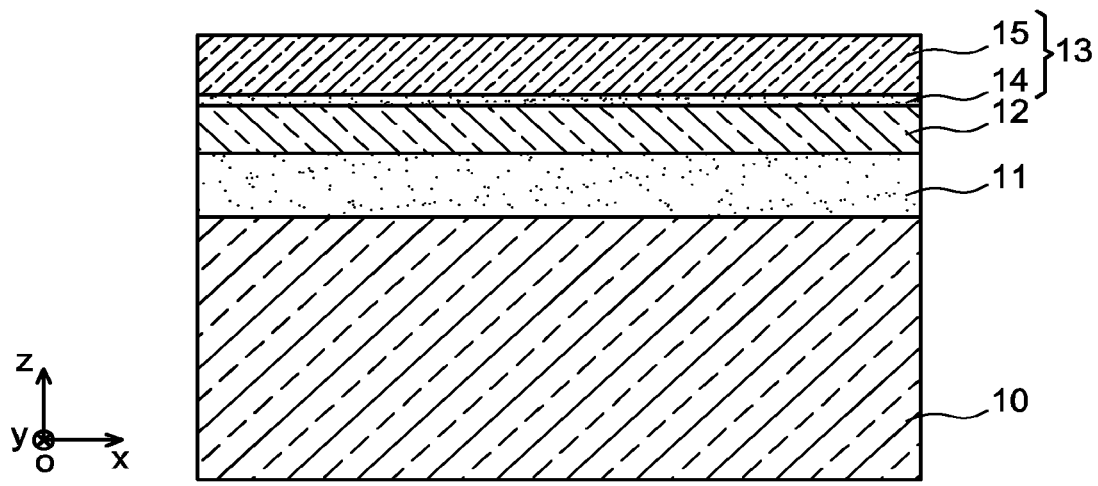
FIGS. 1A to 1I show a first example method for producing at least one semiconducting structure of a transistor channel compressively strained using a stress memorisation technique.

A step to deposit a sacrificial layer 13 is then done (FIG. 1A). The sacrificial layer 13 may be formed of a gate stack comprising a gate dielectric layer 14, for example silicon dioxide ($SiO_2$), for example between 1 nm and 5 nm thick, and a gate material layer 15, for example polysilicon, for example between 20 nm and 80 nm thick.

As a variant, the sacrificial layer 13 may be formed from a single material such as silicon dioxide.

One or several blocks 13a are then formed in said sacrificial layer 13. This can be done for example by photolithography and etching through a hard stencil 6. The hard stencil 6 may for example be based on $SiO_2$ when the sacrificial layer 13 is formed from a gate stack.

Figure 1B:
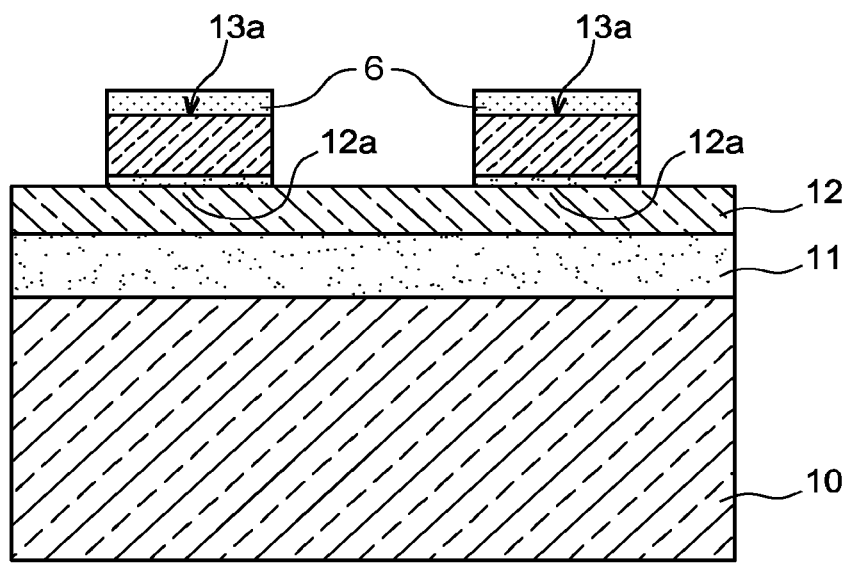

The blocks 13a form gates that will be denoted as "sacrificial" on regions 12a of the surface semiconducting layer 12 in which the transistor channels will be made (FIG. 1B).

An insulating layer 17 is then deposited in order to cover the top and the lateral walls of the sacrificial gate blocks 13a. The insulating layer 17 may for example be based on silicon nitride between 5 nm and 70 nm thick.

Figure 1C:
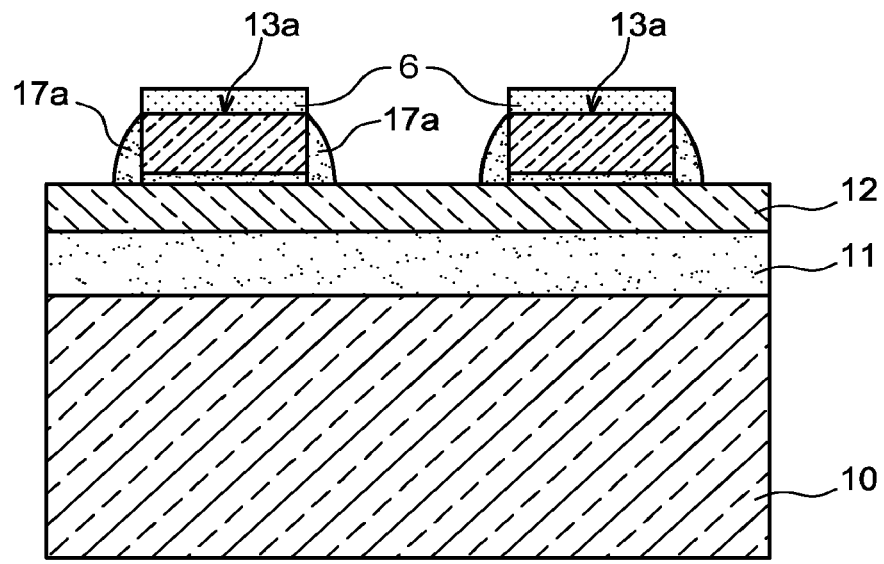

Insulating spacers 17a are then formed on the lateral walls of the sacrificial gate blocks 13a, by etching the insulating layer 17, for example using an anisotropic reactive ion etching method (FIG. 1C).

Figure 1D:
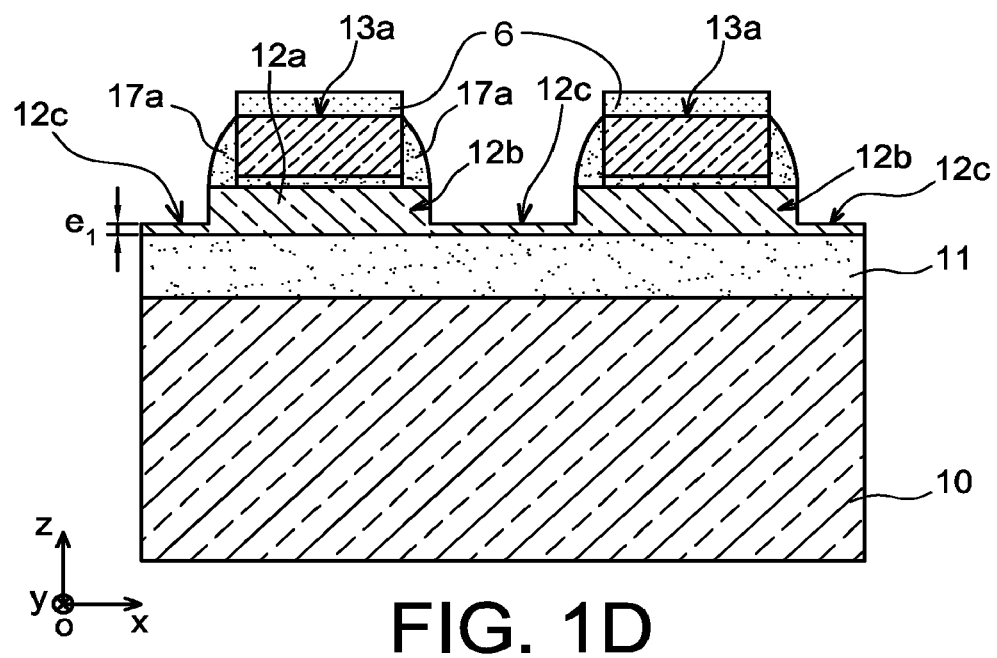

The surface semiconducting layer 12 is then etched so as to define semiconducting zones 12b located under the sacrificial gate blocks 13a and the spacers 17a (FIG. 1D). The semiconducting zones 12b are delimited laterally by lateral flanks vertically in line with the spacers 17a. Each semiconducting zone 12b contains a region 12a that will form a transistor channel. This etching step of the surface semiconducting layer 12 is done without reaching the insulating layer 11 so as to keep a thickness $e_1$ of the surface semiconducting layer 12 in a part 12c located around or on each side of the semiconducting zones 12b.

The thickness of the thinned part 12c of the surface semiconducting layer 12 is equal to $e_1$ (the thickness being measured along a direction z orthogonal to the principal plane of the substrate, in other words a plane of the substrate that is parallel to the [0; x; y] plane in the [O; x; y; z] orthogonal coordinate system in FIG. 1D) that may for example be between 1 nm and 15 nm.

Figure 1E:
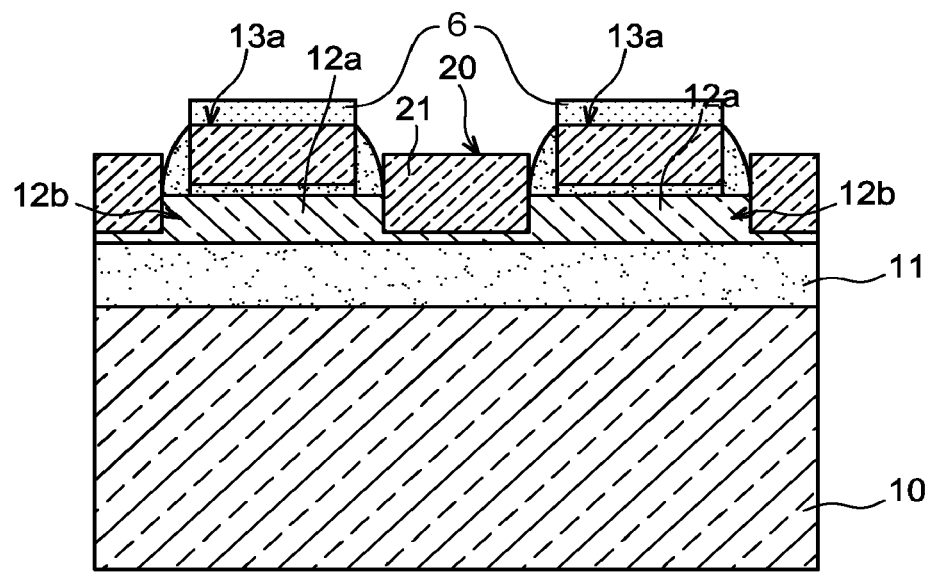

Sacrificial semiconducting regions 20 are then produced by epitaxy on the thinned part 12c of the surface semiconducting layer 12 (FIG. 1E). The sacrificial semiconducting regions 20 are thus made on each side of the semiconducting zones 12b and are adjacent to these zones 12b.

The sacrificial semiconducting regions 20 are formed from a semiconducting material 21 that will be called a <<second semiconducting material>>.

The lattice parameter of the second semiconducting material 21 is different from the lattice parameter of the semiconducting material forming the semiconducting zones 12b and that will be called the <<first semiconducting material>>. The second semiconducting material 21 in this case is selected for its mechanical properties rather than for its electrical properties. Thus, the second semiconducting material 21 is preferably optimised to induce a strain in the semiconducting zones 12b. The second semiconducting material 21 is not necessarily doped because it will be replaced. The sacrificial semiconducting regions 20 are in contact with the lateral faces of the semiconducting zones 12b and are configured so as to induce a strain on the semiconducting zones 12b and more particularly in a region 12a of these semiconducting zones 12b that will form a transistor channel.

In this example, when the semiconducting zones 12b are based on silicon, the sacrificial regions 20 may be formed from $Si_{1-x}Ge_x$ (where $0<x\leq 1$) so as to induce a compressive strain on the semiconducting zones 12b made of silicon (FIG. 1E). The semiconducting regions 20 may be formed with a high germanium concentration, for example such as $x>0.5$, so as to obtain semiconducting zones 12b with a high compressive strain. The hard stencil 6 is then removed. If the spacers 17a are based on silicon nitride and the hard stencil 6 is based on silicon oxide, selective etching of silicon oxide relative to silicon nitride is possible.

Figure 1F:
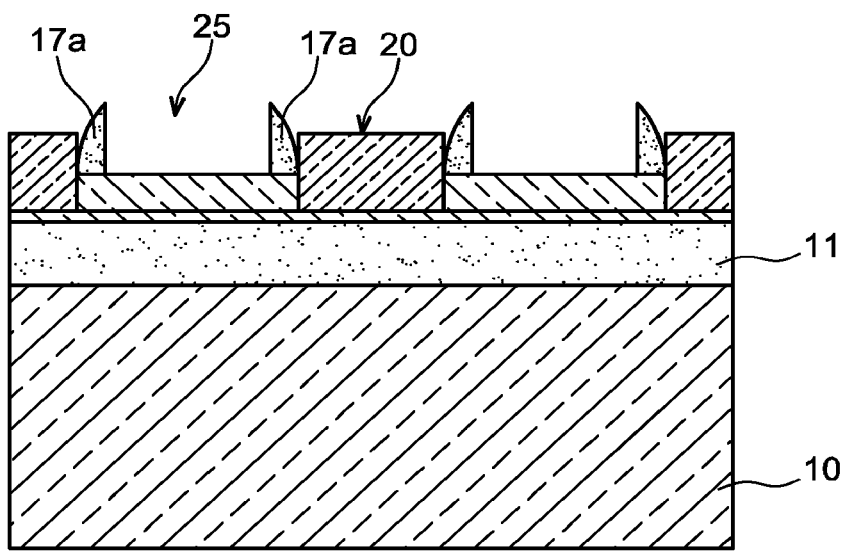

The sacrificial gate blocks 13a between the spacers 17a are then removed (FIG. 1F).

This removal steps leads to the formation of cavities 25 between the spacers 17a. Such a removal step tends to eliminate the stiffness imposed by the sacrificial gate blocks 13a and increases the stress induced in the semiconducting zones 12b by the sacrificial semiconducting regions 20. This removal step can be done for example by selective etching using an $NH_4OH$ technique to eliminate polysilicon and hydrofluoric acid (HF) so as to eliminate silicon dioxide.

Figure 1G:
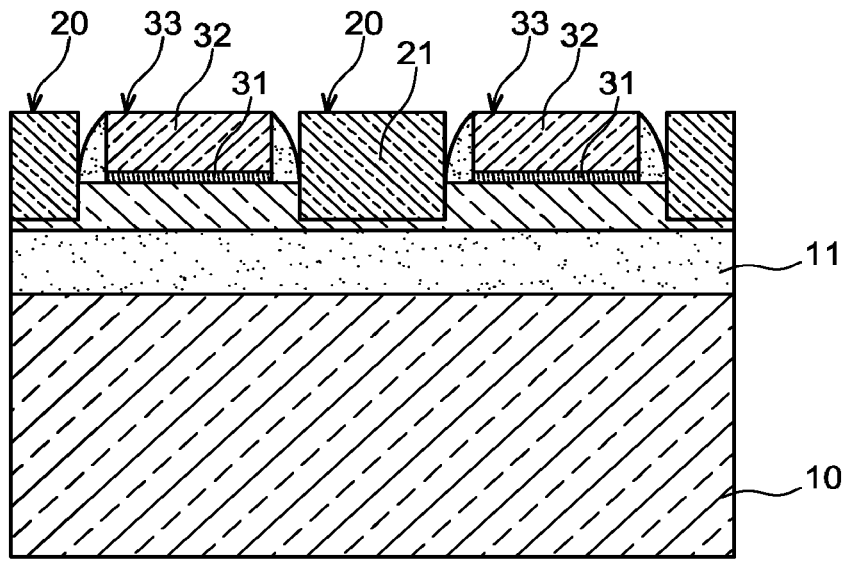

At least one dielectric material 31 and at least one gate material 32 are then deposited so as to fill the cavities 25 and to form gate blocks 33 (FIG. 1G).

The gate dielectric material 31 may be a dielectric with a high dielectric constant, for example hafnium dioxide ($HfO_2$). The gate material may be a semiconductor-based material for example polysilicon, or a metallic material for example titanium nitride (TiN). As a variant, the dielectric may be formed from a stack of several layers. The gate material may also be formed from a stack of several layers, for example a layer of metallic material and a layer of semiconducting material.

A step to eliminate the excess material can then be performed, for example using a CMP (Chemical Mechanical Planarization) method. Deposition of this <<final>> gate stack provides a means of "memorising" the stress in the gate region.

Materials with a high Young's modulus are preferred to achieve a high stress memorisation effect. The memorisation effect increases as the value of Young's modulus increases. Thus, the dielectric material 31 in contact with the silicon channel region 12a is chosen to have a higher Young's modulus than the material in the semiconducting zone 12c, and preferably as high as possible. Materials with a high dielectric constant such as hafnium dioxide (HfSiON) can be used. Such materials usually have a higher Young's modulus than semiconducting materials that can be used to form the semiconducting zone 12c.

Figure 1H:
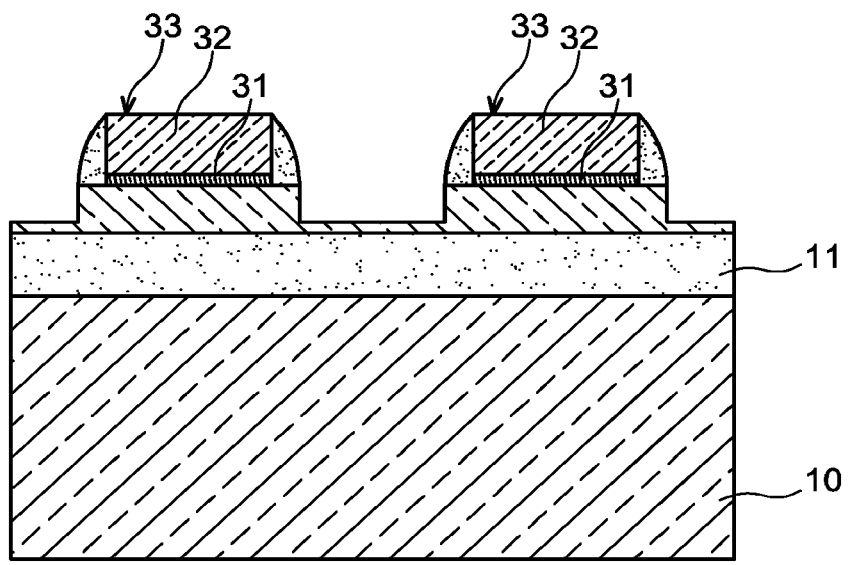

The sacrificial semiconducting regions 20 are then at least partially removed (FIG. 1H).

When the semiconducting regions 20 are based on $Si_{1-x}Ge_x$ (where $0<x\geq 1$), this removal step may be achieved using a wet etching technique for example using hydrochloric acid (HCl) or an SC1 (Standard Clean 1) solution typically based on $5H_2O/NH_4OH/H_2O_2$. In the case of partial removal, such partial removal may be done using a dry etching technique.

Despite removal of the sacrificial semiconducting regions 20, the stress induced in the semiconducting zones 12b is at least partially memorised as a result of the previous steps to remove the sacrificial gate and replace it by another gate stack.

Figure 1I:
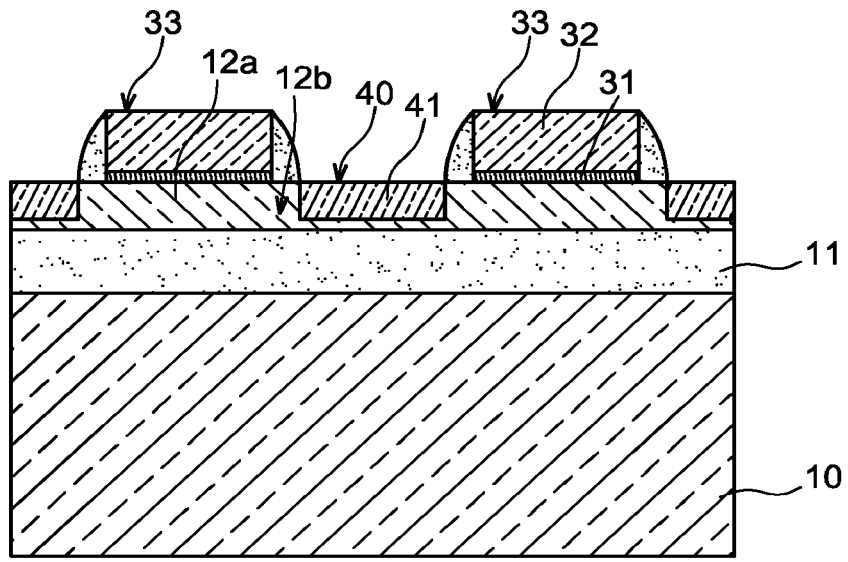

The sacrificial regions 20 are then replaced by semiconducting regions 40 based on a semiconducting material 41 called the <<third semiconducting material>> that is different from the second semiconducting material 21 (FIG. 1I). While the choice of the second semiconducting material 21 depends on the mechanical configuration of the structure, the third semiconducting material 41 is selected for its electrical properties including conductivity, parasitic capacitances, leakage currents at junctions and contact resistance.

Thus, the third semiconducting material 41 may be a material with better adapted electrical properties than the second semiconducting material 21.

The third semiconducting material 41 is advantageously a doped material. In situ doping of the third semiconducting material 41 may be achieved during its formation by epitaxy.

The third semiconducting material 41 may also be chosen so as to have a lattice parameter better adapted to induce a stress in the semiconducting zones 12b.

If the second semiconducting material 21 is made of $Si_{1-x}Ge_x$ with a high germanium concentration x, for example such that $x\geq 0.6$, the third semiconducting material 41 may for example be chosen based on $Si_{1-y}Ge_y$:B in other words Boron-doped silicon germanium with a germanium concentration y (where $0<y<1$) less than the germanium concentration x in the second semiconducting material 21, and with boron doping for example of the order of 1% atoms or 2% atoms. The third semiconducting material 41 may possibly be formed from a plurality of SiGe:B layers with germanium and boron compositions adapted to maximise the electrical performances of source drain regions of junctions until contact.

According to another example embodiment, the third semiconducting material 41 may be silicon.

Another example of a method for producing at least one semiconducting structure of a stressed transistor channel is shown in FIGS. 2A to 2D.

This other example method may be applied to form an N type transistor channel with a tensile strained channel region.

Figure 2A:
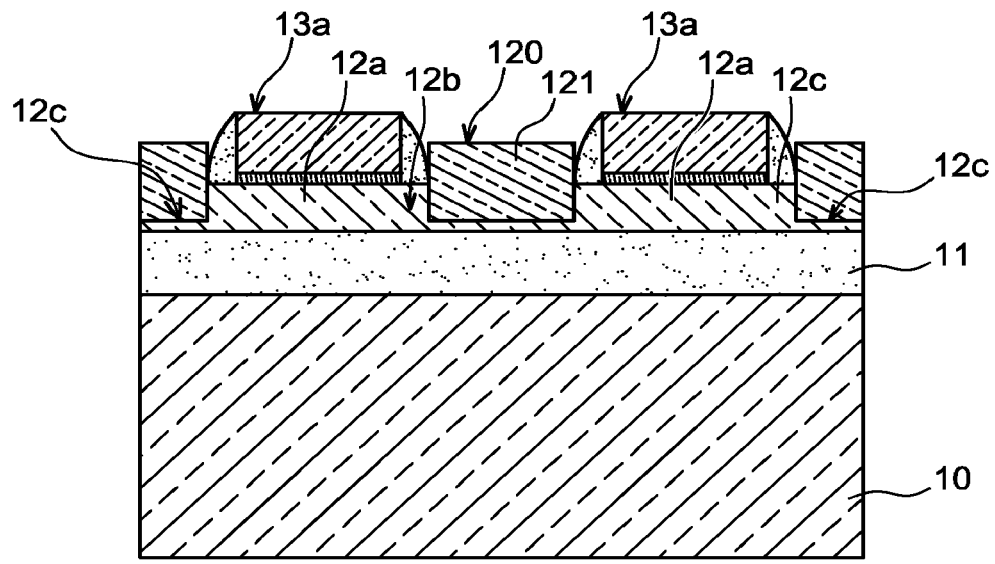
FIGS. 2A to 2E show a second example method for producing at least one semiconducting structure of a transistor channel strained in tension using a stress memorisation technique.
Figure 2B:
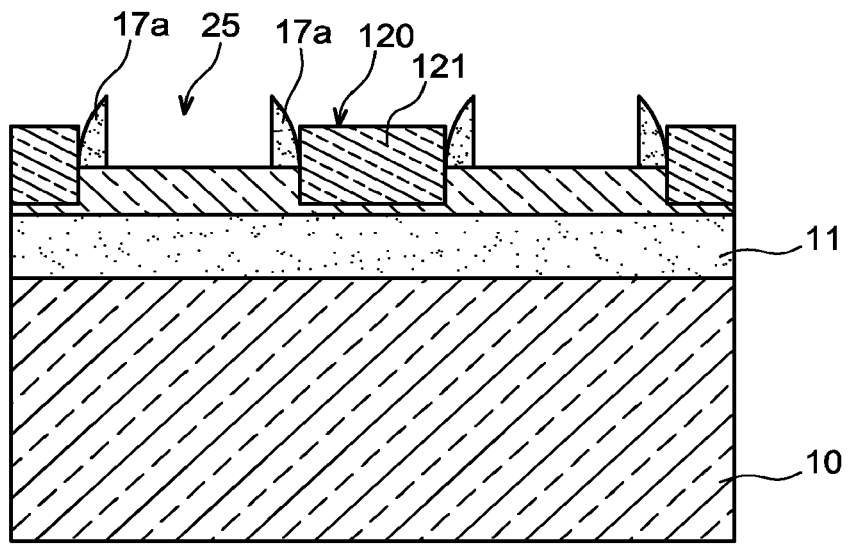

In this example, after the formation of sacrificial gate blocks 13a and insulating spacers 17a, and after etching the surface semiconducting layer 12 to form etched semiconducting zones 12b, sacrificial semiconducting regions 120 are formed by epitaxy on the thinned part 12c of said surface semiconducting layer 12 located on each side of the etched semiconducting zones 12b (FIG. 2A).

The sacrificial semiconducting regions 120 in this example are formed from a semiconducting material 121 selected for its mechanical properties and with a smaller lattice parameter than that of the semiconducting material from which semiconducting zones 12b are made. The semiconducting material 121 is thus used to induce a tensile strain on the semiconducting zones 12b.

In this example, when the semiconducting zones 12b are based on silicon, sacrificial regions 120 may be formed from Carbon-doped silicon (Si:C) in order to induce a tensile strain in Si zones 12b. The semiconducting regions 120 may be formed with the highest possible carbon concentration, so as to obtain the smallest possible lattice parameter compared with pure Si and thus maximise the tensile strain in the semiconducting zones 12b.

The dummy gate blocks 13a are then removed (FIG. 2B) to expose cavities 25. The removal step may for example be done by selective wet etching using $NH_4OH$ in order to eliminate polysilicon and an HF-based aqueous solution in order to eliminate silicon dioxide.

Figure 2C:
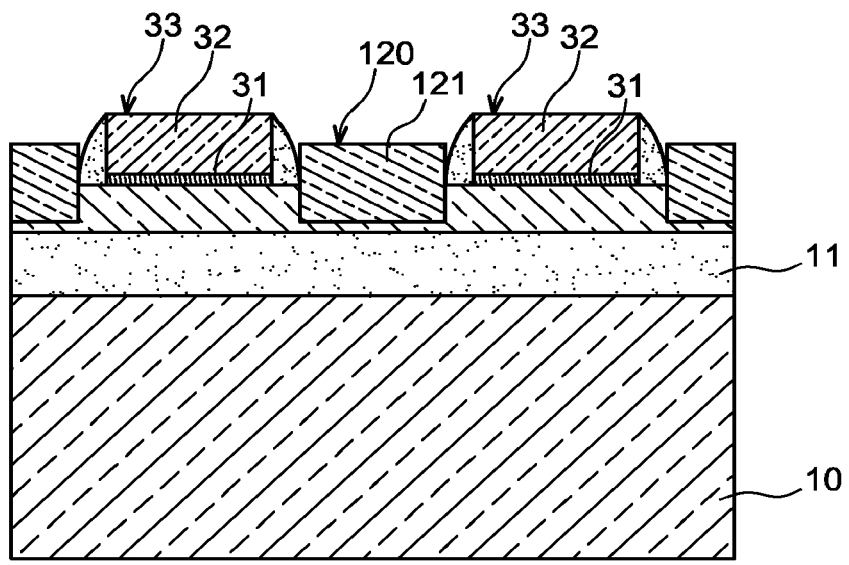

A gate dielectric material 31 and a gate material 32 are then deposited so as to fill the cavities 25 and to form gate blocks 33. These deposits may be made at low temperature, particularly at a temperature of less than 700° C. (FIG. 2C).

The gate dielectric material 31 may be a material with a high dielectric constant and a high Young's modulus, for example hafnium dioxide (HfSiON). The gate material 32 may be a material based on a semiconductor, for example polysilicon or a metallic material, for example such as titanium nitride, or a stack of metal and semiconductor.

Figure 2D:
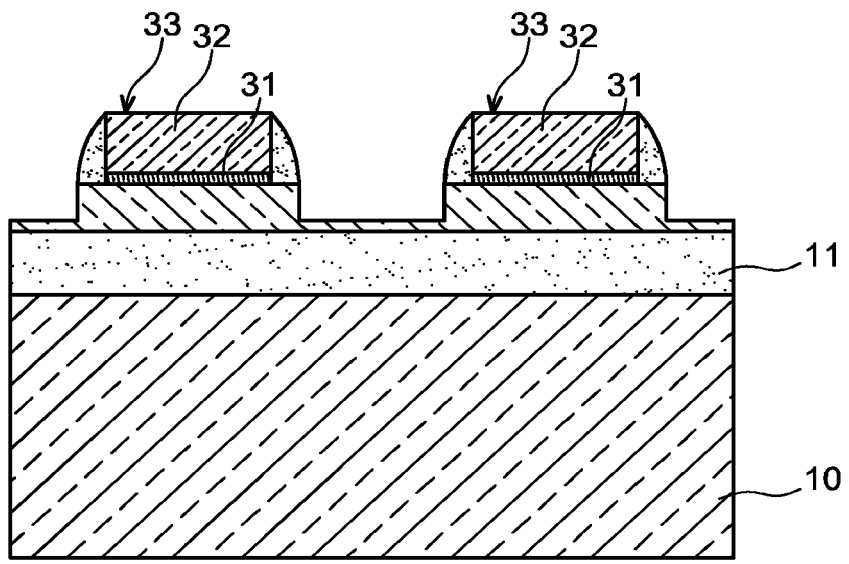

Sacrificial semiconducting regions 120 are then at least partially removed (FIG. 2D). When the semiconducting regions 120 are based on Carbon-doped silicon, this elimination step may be achieved for example by a dry etching technique, for example using a plasma.

Despite the removal of semiconducting regions 120, the tensile strain applied in the semiconducting zones 12b is at least partially memorised as a result of the previous steps to remove the dummy gate and replace it by another gate stack.

Figure 2E:
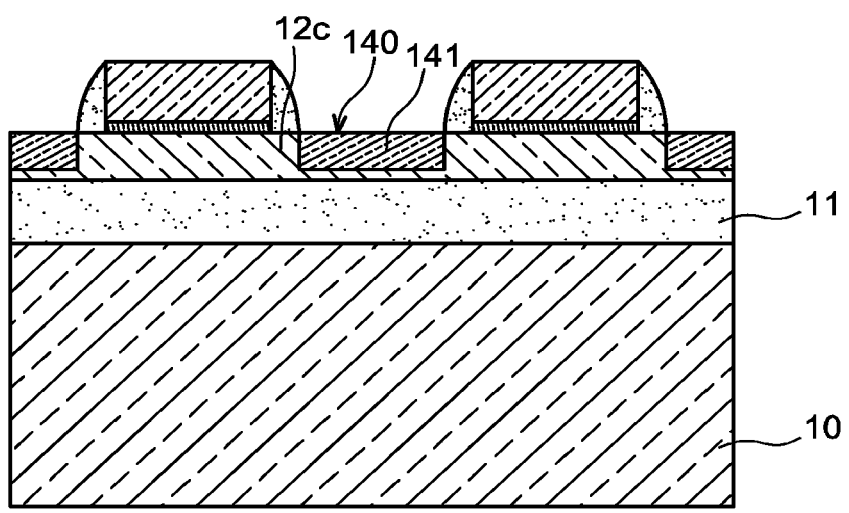

The sacrificial regions 120 are then replaced by semiconducting regions 140 based on a semiconducting material 141 different from the semiconducting material 121 (FIG. 2E). The replacement semiconducting material 141 is selected for its electrical properties. Thus, the semiconducting material 141 may be a material with better electrical properties, particularly concerning the mobility of carriers, than the semiconducting material 121. The replacement semiconducting material 141 may for example be silicon.

The semiconducting material 141 may be formed by epitaxy using part of the surface layer 12 as the germ layer. In situ doping may be done during epitaxy. Alternatively, the semiconducting material 141 may be doped by ion implantation.

A method like that described above advantageously uses a reduced thermal budget.

Figure 3A:
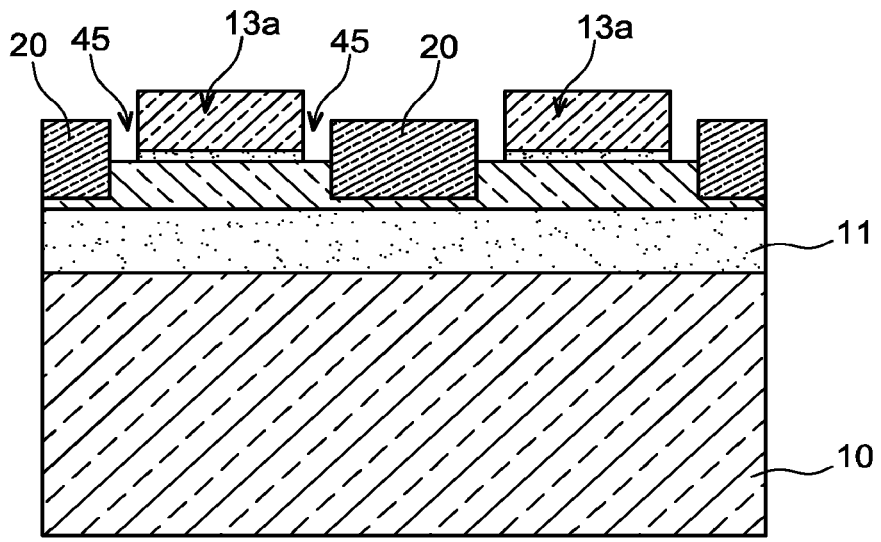
FIGS. 3A to 3B show a variant of the method for increasing the strain in the transistor channel.
Figure 3B:
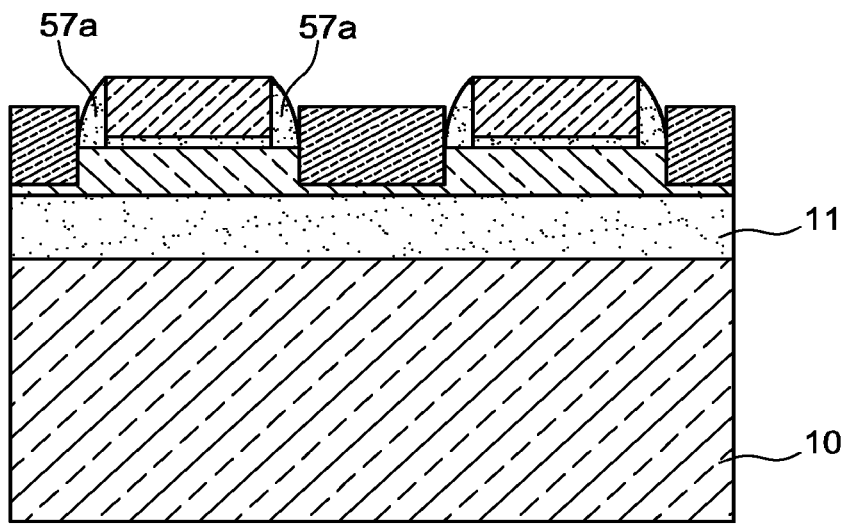

A variant of the method described as an example with reference to FIGS. 1A to 1I is shown in FIGS. 3A to 3B.

Such a variant can increase the strain induced on the semiconducting regions 12a.

Spacers 17a are removed after the step to form the sacrificial semiconducting regions 20 described with reference to FIG. 1E. Such a removal may be done by selective etching using hot phosphoric acid $H_3PO_4$ for example at 165° C., or an ultra-dilute HF-based solution when the spacers 17a are based on silicon nitride.

This elimination step leads to the formation of empty spaces 45 on each side of the sacrificial gate blocks 13c. Such an elimination step tends to reduce the stiffness imposed by the spacers 17a and increases the strain induced in the semiconducting zones 12b by the sacrificial semiconducting regions 20.

A dielectric layer, for example based on silicon nitride, is then deposited in order to fill the empty spaces 45. This dielectric layer is then etched so as to form replacement insulating spacers 57a.

Figure 4A:
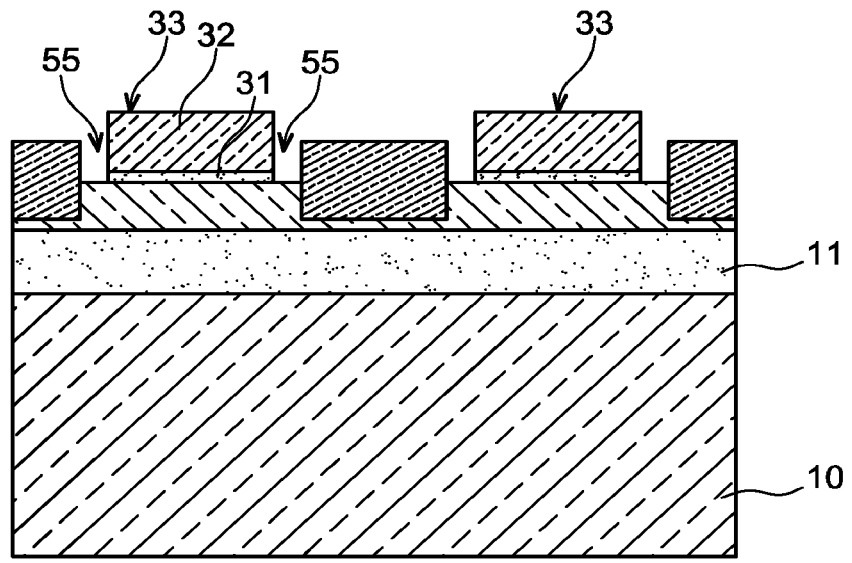
FIGS. 4A to 4B show a variant of the method for increasing the strain in the transistor channel.
Figure 4B:
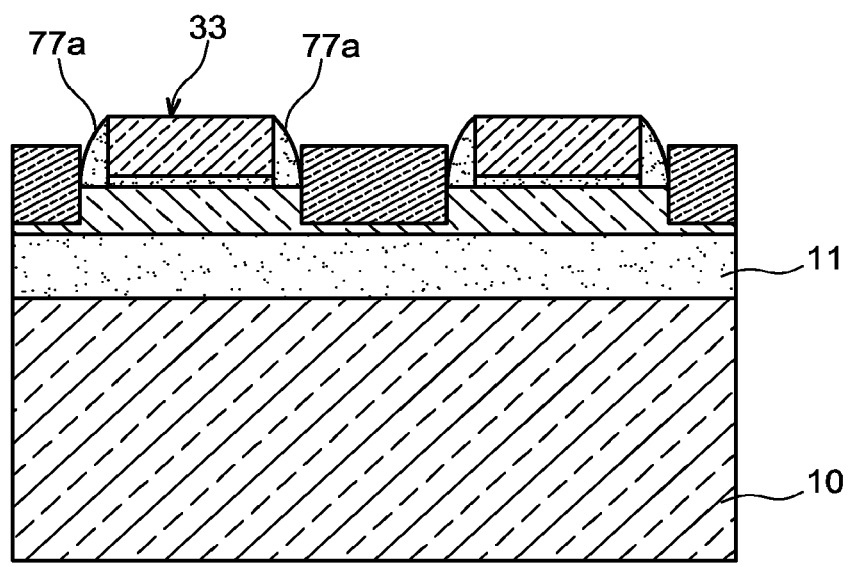

Another variant of the method for example like that described with reference to FIGS. 1A to 1I, is shown in FIGS. 4A to 4B.

Such a variant can also increase the strain induced on the semiconducting zones 12b and may be done in combination with the variant described above with reference to FIGS. 3A to 3B.

After the replacement step of the dummy gate blocks 13a by gate blocks 33 and what has been described with reference FIG. 1G, the spacers 17a are removed. Such a removal may be done by selective etching using hot phosphoric acid, typically at 165° C. when the spacers 17a are made of silicon nitride. This removal step leads to the formation of empty spaces 55 on each side of the sacrificial gate blocks 13c (FIG. 4A). Such a removal step tends to eliminate the stiffness imposed by the spacers 17a and increases the strain induced in the semiconducting zones 12b by the sacrificial semiconducting regions 20.

A dielectric layer is then deposited in the empty spaces 55 and can be etched to form replacement insulating spacers 77a (FIG. 4B).

Figure 5A:
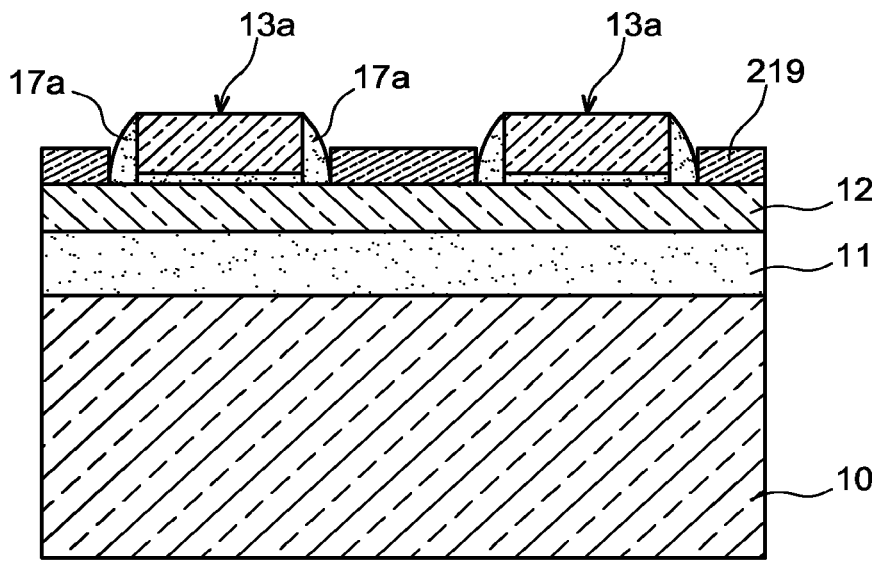
FIGS. 5A to 5C show an example method for producing sacrificial semiconducting regions with a germanium condensation technique.
Figure 5B:
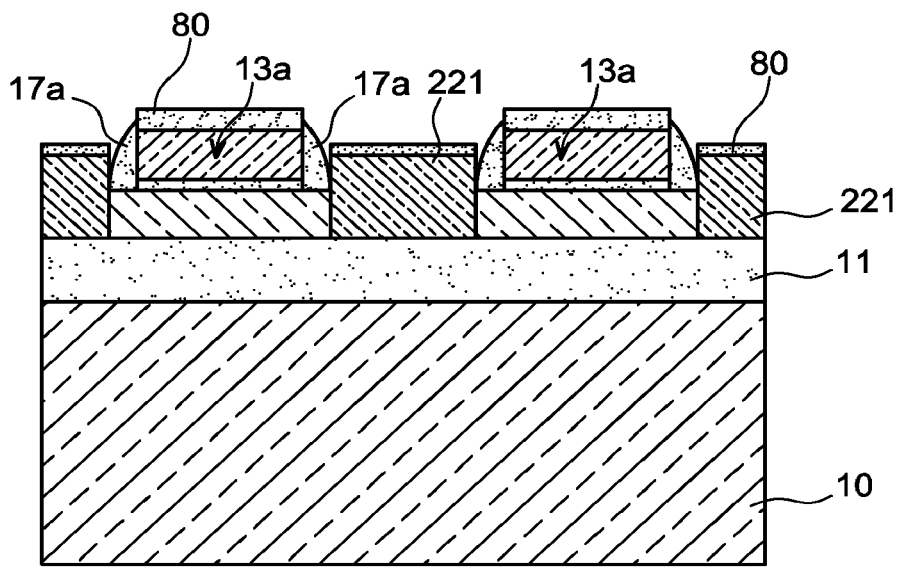

According to another variant of the example methods described above, the sacrificial regions made in contact with the lateral faces of the semiconducting zone 12b may be formed using a germanium condensation method (FIGS. 5A to 5B).

Semiconducting regions 219 based on $Si_{1-a}Ge_a$ (where $0<a\leq1$) are formed after the formation of insulating spacers 17a, for example by epitaxy of SiGe, on the part 12c of the surface semiconducting layer 12 that was thinned and that is located on each side of the semiconducting zones 12b that are to be strained (FIG. 5A).

An oxidation step is then performed on the regions 219 based on $Si_{1-a}Ge_a$ at a high temperature T, particularly to enable maximum oxidation of the SiGe alloy, for example of the order of 1100° C. when the Ge fraction a is of the order of 0.25 or 900° C. when the Ge fraction a is of the order of 0.8.

The insulating spacers 17a and gate blocks provide protection against oxidation during this oxidation step.

Once the oxidation step is complete, the regions 221 based on $Si_{1-x}Ge_x$ (where x>a) are created on the thinned part 12c of the surface semiconducting layer located on each side of the semiconducting zones 12b. The regions 221 based on $Si_{1-x}Ge_x$ may be covered by a silicon dioxide-based layer 80 formed during oxidation (FIG. 5B).

Figure 5C:
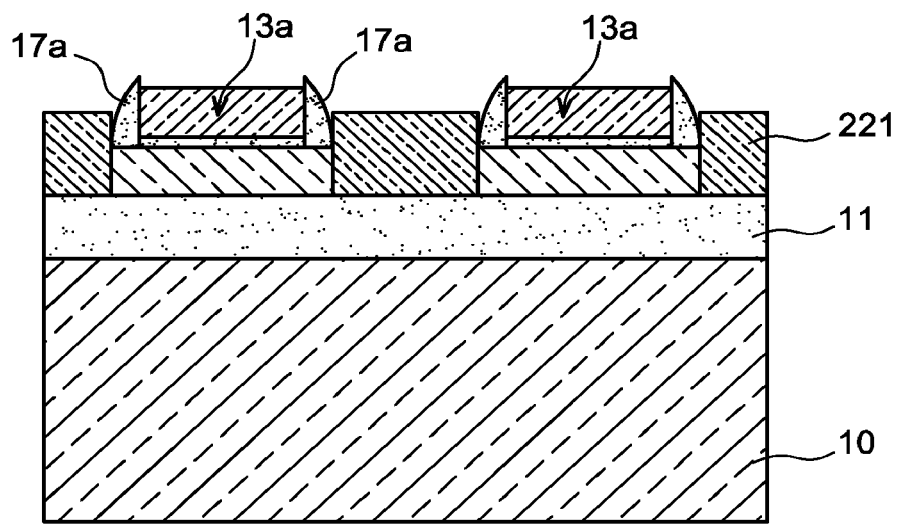

The silicon dioxide-based layer 80 formed during oxidation can be eliminated by selective etching. This selective etching can be done by wet etching for example using HF (FIG. 5C).

The methods given as examples correspond to an application for a planar transistor structure using the CMOS technology.

However, such a method may be applied to other types of technologies and other channel structures, for example to apply a strain to finFET transistor channels.

The invention claimed is:

1. Method of making at least one strained channel semiconducting structure for a transistor, comprising the following steps:
   form a sacrificial gate block and insulating spacers arranged in contact with the lateral faces of the sacrificial gate block, on a semiconducting zone based on a first semiconducting material comprising a region that will form a transistor channel region,
   form sacrificial regions on each side of the semiconducting zone, the sacrificial regions being based on a second semiconducting material and being configured so as to induce a strain in the semiconducting zone, then,
   in this order:
   remove the sacrificial gate block;
   replace the sacrificial gate block by a replacement gate block between the insulating spacers;
   remove the sacrificial regions;
   replace the sacrificial regions by replacement regions located on each side of the semiconducting zone, the replacement regions being based on a third semiconducting material different from the second semiconducting material.

2. Method according to claim 1, the third semiconducting material being doped.

3. Method according to claim 1, in which the transistor is a P type transistor, the second semiconducting material being adapted to strain the semiconducting zone in compression.

4. Method according to claim 3, the semiconducting zone forming part of a silicon semiconducting layer, the sacrificial regions being $Si_{1-x}Ge_x$-based regions (where x>0).

5. Method according to claim 4, the sacrificial regions being $Si_{1-x}Ge_x$-based regions formed by germanium condensation.

6. Method according to claim 4, the replacement regions being formed from silicon or $Si_{1-y}Ge_y$ (where x≥y).

7. Method according to claim 1, in which the transistor is an N type transistor, the second semiconducting material being adapted to induce a tensile strain in the semiconducting zone.

8. Method according to claim 7, the semiconducting zone forming part of a silicon semiconducting layer, the sacrificial regions being regions based on Carbon-doped silicon (Si:C).

9. Method according to claim 8, the replacement regions being formed from silicon.

10. Method according to claim 8, in which the replacement regions are formed by epitaxy during which in-situ doping of replacement regions is performed.

11. Method according to claim 9, the replacement regions being doped by ion implantation followed by thermal annealing.

12. Method according to claim 1, in which the semiconducting zone forms part of a semiconducting layer, the method further comprising a step to etch the semiconducting layer before the formation of sacrificial regions, so as to remove a thickness from the semiconducting layer and to expose lateral faces of the semiconducting zone, the sacrificial regions then being formed on a remaining thinned part of the semiconducting layer located on each side of the semiconducting zone, the sacrificial regions being arranged in contact with the lateral faces of the semiconducting zone.

13. Method according to claim 1, in which the method further comprises the following sequence of steps once or several times after the formation of sacrificial regions and before removal of the sacrificial gate block:
   eliminate the insulating spacers,
   replace the insulating spacers by replacement spacers.

14. Method according to claim 1, characterised in that, after replacement of the sacrificial gate block by the replacement gate block and before elimination of the sacrificial regions, the method comprises the following sequence of steps once or several times:
   eliminate insulating spacers,
   replace spacers by other insulating spacers.

15. Method according to claim 1, the semiconducting zone forming part of a surface semiconducting layer of a semiconductor on insulator type substrate.

16. Method according to claim 1, in which the sacrificial regions are arranged in contact with lateral faces of the semiconducting zone.

17. Method according to claim 1, in which the replacement regions are arranged in contact with lateral faces of the semiconducting zone.

18. Method according to claim 17, the second semiconducting material not being doped.

* * * * *